United States Patent [19]

Ong et al.

[11] Patent Number: 4,767,695

[45] Date of Patent: Aug. 30, 1988

[54] NONPLANAR LITHOGRAPHY AND DEVICES FORMED THEREBY

[75] Inventors: Edith T. T. Ong, New Providence; King L. Tai; Yiu-Huen Wong, both of Berkeley Heights, all of N.J.

[73] Assignee: American Telephone and Telegraph Company, AT&T Bell Laboratories, Murray Hill, N.J.

[21] Appl. No.: 57,682

[22] Filed: May 28, 1987

Related U.S. Application Data

[63] Continuation of Ser. No. 665,970, Oct. 29, 1984, abandoned.

[51] Int. Cl.$^4$ .................................................. G03C 5/00
[52] U.S. Cl. ............................................ 430/311; 430/312; 430/319; 430/270
[58] Field of Search ............... 430/270, 311, 312, 319; 427/82, 87, 89

[56] References Cited

U.S. PATENT DOCUMENTS

| | | | |
|---|---|---|---|
| 4,005,437 | 1/1977 | Ross et al. | 430/296 |
| 4,127,414 | 11/1978 | Yoshikawa et al. | 430/270 |
| 4,127,436 | 11/1978 | Friel | 430/319 |
| 4,141,780 | 2/1979 | Kleinknecht et al. | 427/10 |
| 4,194,285 | 3/1980 | Goel | 430/319 |
| 4,283,243 | 8/1981 | Andreades et al. | 430/319 |
| 4,302,530 | 11/1981 | Zemel | 430/319 |
| 4,357,179 | 11/1982 | Adams et al. | 427/35 |
| 4,454,221 | 6/1984 | Chen et al. | 430/317 |
| 4,532,002 | 7/1985 | White | 430/315 |
| 4,537,854 | 8/1985 | Crivello | 430/925 |

OTHER PUBLICATIONS

Keizer, E. O., "Video Disc Mastering," RCA Review, vol. 39, pp. 60-86, Mar. 1978.
Nosker et al., "Basics of Video Disc Systems . . . ", RCA Review, vol. 43, pp. 179-193, Mar. 1982.
Firester et al., "Optical Recording Techniques for the RCA Video Disc", RCA Review, vol. 39, pp. 427-471, Sep. 1978.

*Primary Examiner*—Paul R. Michl
*Assistant Examiner*—Patrick A. Doody
*Attorney, Agent, or Firm*—Bernard Tiegerman

[57] ABSTRACT

A new method for lithographically patterning nonplanar substrates is disclosed. In accordance with this method, a nonplanar substrate surface is patterned by initially substantially conformably coating the surface with a resist. Conformality is achieved by depositing the resist either from the vapor phase or from a mist. In addition, the motions of the constituents of the vapor or mist should be sufficiently random so that the angular flux distribution at any point on the nonplanar substrate surface to be coated is substantially identical to that at any other point to be coated.

7 Claims, 2 Drawing Sheets

NONPLANAR LITHOGRAPHY AND DEVICES FORMED THEREBY

This is a continuation of application Ser. No. 665,979, filed Oct. 29, 1984, now abandoned.

BACKGROUND OF THE INVENTION

1. Field of the Invention

The invention pertains to lithographic processes for producing devices such as semiconductor devices.

2. Art Background

Lithographic processes play an important role in the manufacture of devices such as semiconductor devices. During the manufacture of such devices, a substrate is coated with an energy-sensitive material called a resist. Selected portions of the resist are exposed to a form of energy which induces a change in the solubility or reactivity of the exposed portions in relation to a given developing agent or etchant. By applying the developing agent or etchant to the resist, the more soluble or reactive portions of the resist are removed and portions of the substrate are bared. The bared portions of the substrate are then treated, e.g., etched or metallized.

Both organic and inorganic materials have been used as resists. The organic materials are typically organic polymers such as novolak resins which include quinone diazide sensitizers, while the inorganic materials are exemplified by chalcogenide glass-based materials such as germanium-selenium (Ge-Se) glass films supporting relatively thin layers of silver selenide ($Ag_2Se$). (Chalcogenide glass-based materials are materials which exhibit a noncrystalline structure and whose major constituent is sulfur, selenium, tellurium, or compounds thereof.) An organic polymer resist is typically spin-deposited onto a substrate. A Ge-Se glass film, on the other hand, is typically evaporated, e.g., e-beam evaporated or rf-sputtered, onto a substrate, and an $Ag_2Se$ layer is formed on the surface of the Ge-Se glass film by dipping the film into an appropriate sensitizing bath.

The two types of resists, i.e., organic and inorganic resists, are useful in patterning essentially flat substrate surfaces, but difficulties arise when patterning nonplanar substrate surfaces, such as stepped substrate surfaces. For example, when an organic polymer resist (having a typical thickness of about 1-2 $\mu$m) is spin-deposited onto a stepped surface having, for example, step heights greater than about 5 $\mu$m, the resulting coating thickness is either discontinuous or substantially nonuniform, i.e., the coating sections covering the stepped portions of the surface are significantly thinner (typically more than about 50 percent thinner) than the coating sections covering the flat portions of the surface. Energy sufficient to ensure exposure of the thick resist sections causes overexposure of the thin sections. This overexposure results in a loss of linewidth control during pattern transfer into the substrate.

Attempts to overcome the difficulties associated with the patterning of stepped surfaces have involved the use of multilevel, e.g., bilevel, resists. For example, with bilevel resists, a relatively thin resist region is formed on a relatively thick, and thus planar, layer of an organic polymer (which need not be energy-sensitive) overlying a stepped surface. (In the case of, for example, the chalcogenide resists, a thick, planarizing layer is almost always deposited onto the substrate surface, regardless of whether it is stepped or flat, prior to deposition of the resist.) After exposure and development, the pattern defined in the resist is transferred into the planarizing layer by using the former as an etch mask during etching of the latter. Finally, the substrate is patterned by, for example, etching or metallizing the substrate surface through the patterned planarizing layer.

Bilevel resists (as well as other multilevel resists) are useful in patterning stepped surfaces where the step heights are less than about 5 $\mu$m. However, while bilevel (and other multilevel) resists are still useful when patterning stepped surfaces having step heights greater than about 5 $\mu$m, difficulties do arise. For example, the thickness of the planarizing layer covering a 5 $\mu$m-step (in a surface having steps interspersed between flat portions) is often significantly less (typically more than about 50 percent less) than that covering the flat portions. Thus, when transferring a pattern to the planarizing layer using, for example, an isotropic etchant, the thin sections of the planarizing layer suffer excessive lateral etching during the additional time required to etch through the relatively thick sections. This excessive lateral etching results in a loss of linewidth control during pattern transfer into the substrate. Alternatively, if an anisotropic etching, e.g., reactive ion etching, technique is used, the additional time required to etch through the thickest portion of the planarizing layer causes pattern erosion of the overlying resist with a concomitant loss of linewidth control.

The difficulties associated with patterning nonplanar substrates have produced constraints on the fabrication of devices, e.g., semiconductor integrated circuit devices, having three-dimensional geometries, such as devices having components on the top, the bottom, or even on the sidewall, of a deep (deeper than about 5 $\mu$m) V-groove or high (higher than about 5 $\mu$m) step. Three-dimensional devices offer the possibility of increased packing densities using nominal design rules but, as discussed, techniques for patterning nonplanar substrates to achieve such devices have proven to be an elusive goal.

SUMMARY OF THE INVENTION

The invention involves a lithographic technique for fabricating devices on nonplanar substrates, as well as the resulting devices. In accordance with this technique, a nonplanar substrate is patterned by initially forming a substantially conformal resist region, i.e., a region having a substantially uniform thickness, over the portion (or portions) of the nonplanar substrate surface to be patterned (which encompasses, for example, coplanar, noncoplanar, and inclined portions of the surface). It has been found that such a region is achieved by depositing the resist onto the substrate surface from the vapor (gaseous) phase, or from a mist which includes agglomerates or droplets containing resist material. The dimensions of the agglomerates or droplets should be smaller than about three-fourths the smallest height or depth of any substantial step or depression in the surface. In addition, the motions of the atoms or molecules of the vapor, or of the agglomerates or droplets of the mist, should be sufficiently random so that the angular flux distribution at any point on the nonplanar surface to be patterned is substantially identical to that at any other point on the surface to be patterned. With the conformal mask thus produced, pattern transfer into the underlying substrate, with significantly improved (as compared to previous techniques) linewidth control, is readily achieved.

BRIEF DESCRIPTION OF THE DRAWING

The invention is described with reference to the accompanying drawings, wherein.

DETAILED DESCRIPTION

The invention involves a method for fabricating devices, as well as the devices formed by this method.

Figure 1:
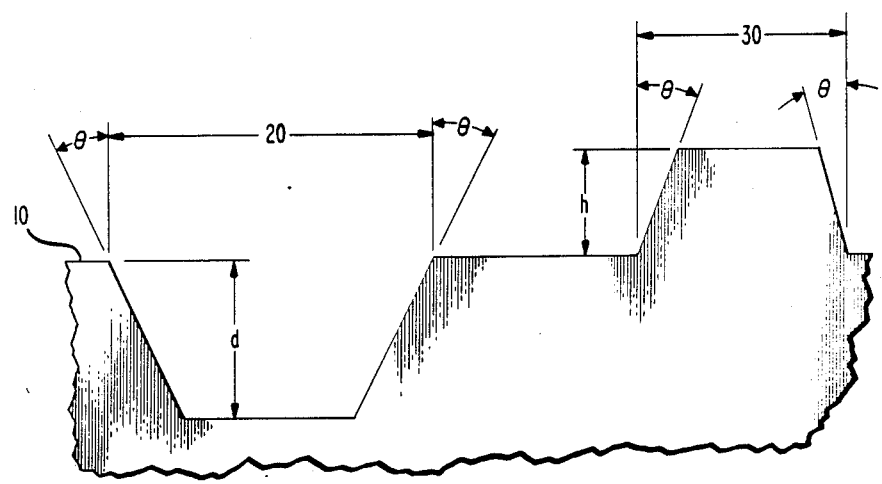
FIG. 1 is a cross-sectional view of a nonplanar substrate surface.

The inventive fabrication method includes a technique for lithographically patterning nonplanar substrate surfaces. For purposes of the invention, and as illustrated in FIG. 1, a nonplanar surface 10 includes at least one depression 20 and/or at least one step 30 (exemplary of possible depressions or steps) whose depth, d, or height, h, is greater than or equal to about 5 $\mu$m. (The depth of a depression or the height of a step is defined with reference to the plane which is the least-square-fit planar approximation to the original substrate surface, e.g., the original wafer surface, which existed prior to the formation of any depression or step in the surface. For purposes of the invention, the depth of a depression is greater than or equal to about 5 $\mu$m provided two criteria are met. First, the length of a perpendicular to the reference plane, extending from the lowest (relative to the reference plane) point of the depression (closest to the depression sidewall if there is more than one such lowest point) to the height of one of the nearby relative maxima in the surface 10 is greater than or equal to about 5 $\mu$m. Second, the length of the shortest line from the relative maximum to the perpendicular should be less than or equal to the length of the perpendicular. Similarly, the height of a step is greater than or equal to about 5 $\mu$m provided the length of a perpendicular to the reference plane, extending from the highest (relative to the reference plane) point of the step (closest to the step sidewall if there is more than one such highest point) to the height of one of the nearby relative minima in the surface 10 is greater than or equal to about 5 $\mu$m. Again, the length of the shortest line from the relative minimum to the perpendicular should be less than or equal to the length of the perpendicular.) In addition, when viewed in cross-section, i.e., when intersected by any plane perpendicular to the above least-squares-fit plane, the portion of the sidewall of the depression or step to be patterned should have a specific angular configuration to substantially conformably coat the portion with a resist. That is, the acute angle $\theta$ (see FIG. 1) between the line which is the least-squares-fit approximation to the left side or right side of the sidewall portion to be patterned (as viewed in cross-section) and a perpendicular projecting from the top of the least-squares-fit plane, at the intersection of the plane with the least-squares-fit line approximating the left or right side of the sidewall portion, should be greater than or equal to 0 degrees but less than or equal to about +45 degrees. The acute angle $\theta$ is positive for the left side (as viewed in FIG. 1) of a depression sidewall or the right side of a step sidewall provided the angle extends in the counterclockwise direction from the perpendicular to the least-squares-fit line approximating the left or right side of the sidewall. On the other hand, the acute angle $\theta$ is positive for the right side of a depression sidewall or the left side of a step sidewall provided the angle extends in the clockwise direction from the perpendicular to the least-squares-fit line approximating the right or left side of the sidewall.

In accordance with the invention, a nonplanar substrate surface is patterned by initially forming a resist on the substrate surface which substantially conformably coats the portions of the substrate surface which it is desired to coat. As used here, a substantially conformal resist coating is one which satisfies two criteria: (1) the coating thickness, at any point on the nonplanar substrate surface to be coated, differs from the average coating thickness (averaged over the portions of the surface which it is desired to coat) by less than or equal to about 50 percent; and (2) the average thickness of the coating is less than about the larger of the depth of the deepest depression or the height of the highest step on the portion or portions of the nonplanar substrate surface to be coated. (The thickness of the resist, as measured from any point on the substrate surface to be coated, is defined as the length of the shortest line extending from the point to the upper surface of the resist.) In general, the thickness limit imposed by criterion (2) leads to highly desirable results. However, in some specific situations, the average resist thickness is advantageously less than this limit. For example, to achieve a particular feature size, it is known that the average resist thickness should be less than about three times the desired feature size. Moreover, it is desirable that the resist be sufficiently thin so that during the exposure procedure, the resist is exposed through its entire thickness, i.e., sufficient exposure energy penetrates to the bottom of the resist to produce a detectable change in solubility or reactivity. For certain exposure tools with limited intensity, the resist thickness is advantageously less than the thickness limit imposed by criterion (2).

It has been found that a substantially conformal resist coating is formed on a nonplanar substrate surface by depositing the resist onto the substrate from the vapor (gaseous) phase. Alternatively, the resist is deposited from a mist which includes agglomerates or droplets containing resist material. The largest dimensions, e.g., diameters or major axes, of these agglomerates or droplets should be equal to or less than about three-fourths the smallest depth or height of any nonplanar feature in the surface to be coated, i.e., any depression or step having a depth or height greater than or equal to about 5 $\mu$m and a sidewall angle, $\theta$, equal to or greater than 0 degrees but less than or equal to about +45 degrees. In addition, the motions of (1) the atoms or molecules of the vapor, or of (2) the agglomerates or droplets of the mist, should be sufficiently random so that the angular flux distribution (the number of impinging particles, e.g., atoms, molecules, agglomerates, and/or droplets, per unit solid angle and per unit time) at any point on the surface to be coated is substantially identical to that at any other point of the surface to be coated. For purposes of the invention, substantial identity in the angular flux distribution is achieved provided that, at any point on the nonplanar surface to be coated, the integrated (over the solid angle enclosing the surface at that point) angular flux distribution (IAFD) differs from the average (averaged over the portions of the nonplanar surface to be coated) IAFD by less than or equal to about 50 percent. Because the IAFD at a point corresponds to the rate of increase of thickness of deposited material at that point, the above condition corresponds to the condition that the rate of increase of thickness of deposited material (readily measured by measuring the rate of increase of thickness of deposited material on substrate control samples) at any point on the nonplanar surface to be coated differs from the average rate of increase of thickness across the portions of the nonplanar surface to be coated by less than or equal to about 50 percent.

A wide variety of resist materials are readily vapor phase deposited using a variety of deposition techniques. For example, the chalcogenide glass-based materials, such as Ge-Se, are readily vapor-phase deposited using conventional e-beam evaporation or rf-sputtering techniques. In addition, many resist materials, particularly organic polymer resists such as the resist sold under the trade name HPR-204 by the Hunt Chemical Company of Palisades Park. N.J., are readily deposited from a mist. This is achieved, for example, by flowing the resist solution (organic polymer resists are typically purchased from commercial suppliers in solution form) through a vibrating nozzle, e.g., an ultrasonic nozzle (such as the one described below), which converts the flowing liquid into droplets.

A number of techniques are also available for producing the degree of randomization (described above) needed to achieve conformality. For example, in the case of a vapor, it has been found that the necessary degree of randomization is automatically achieved provided the mean free path (the average distance traveled between collisions) of the atoms or molecules of the vapor is less than or equal to a specific value related to the topography of the portion or portions of the nonplanar surface to be coated. The specific value is readily determined by first (theoretically or empirically) constructing the thickest imaginary layer which substantially conforms to the portion or portions of the nonplanar surface to be patterned. Such an imaginary layer is constructed, for example, by drawing spheres of equal radius about, and centered upon, each point of the nonplanar surface to be patterned. The surface which is tangent to the portions of the spheres extending above the nonplanar surface constitutes the upper surface of the imaginary layer. (This procedure is similar to the procedure used in defining wavefronts with Huygens' wavelets. In this regard, see, e.g., Borne and Wolfe, *Principles of Optics,* 3rd edition (Pergamon Press, Oxford, 1965).) The specific value is just the thickness of the thinnest portion of the imaginary layer.

As is known, the mean free path, $\lambda$, of an atom or molecule in a particular ambient is related to the collision cross-section, $\sigma$, of that atom or molecule, the ambient pressure, p, and ambient temperature, T, through the relation $$\lambda = \frac{kT}{\sqrt{2}\ \pi p\sigma^2},$$

where k denotes Boltzmann's constant. (Regarding the above relation see, e.g., *Handbook of Thin Film Technology,* L. I. Maissel and R. Glang, editors (McGraw-Hill, New York, 1970), pages 1–21.) The collision cross-section, $\sigma$, of an atom or molecule (if not tabulated) is readily measured using conventional techniques (in this regard see, e.g., S. Dushman, *Scientific Foundations of Vacuum Technique* (Wiley & Sons, New York, 1962), page 39). Thus, knowing $\sigma$, a desired mean free path (needed to achieve conformality) is readily produced by using appropriate values of p and T (in accordance with the above relation). In addition, the mean free path, $\lambda$, as a function of pressure p, and temperature, T, has been tabulated for a wide variety of atoms and molecules (see, e.g., *Handbook of Thin Film Technology,* supra), or is readily measured (as described, for example, by Berne and Pecora in *Dynamic Light Scattering* (Wiley Interscience, New York, 1976)).

Another technique for producing, or increasing the degree of, randomization in a resist vapor formed, for example, by the rf-sputtering method, involves applying a DC bias to the electrode of the sputtering machine supporting the substrate to be conformally coated. That is, the resist material (in solid form) is mounted on a first electrode (what is usually the power electrode) of the sputtering machine, the substrate to be conformally coated is mounted on a second electrode (what is typically the grounded electrode), and an inert gas (or gases), e.g., argon or krypton or xenon, is introduced into the chamber housing the electrodes. If only an rf-signal, e.g., a 13.56 MHz signal, is applied to the first electrode while the second electrode is grounded (as is the usual procedure during rf-sputtering), then a plasma discharge is initiated in the gas and a DC bias produced on the first electrode. Under the influence of this DC bias, ions in the plasma are accelerated toward the solid resist target, removing resist material by collisional impact, thus producing the desired resist vapor. However (unless the mean free path in the resist vapor is less than or equal to the specific value described above), there is often insufficient randomization in the motions of the atoms or molecules of the resist vapor to produce a conformal resist coating on the nonplanar surface, e.g., insufficient randomization to produce a substantially conformal coating on the sidewalls of nonplanar features. But randomization is readily increased, in accordance with the inventive randomization technique, by applying a DC bias (relative to ground, and different from that on the first electrode) to the second (substrate-supporting) electrode. Such a DC bias is produced, for example, by applying an rf-signal (whose frequency and/or peak amplitude is different from that of the rf-signal applied to the first electrode) to the second electrode. Under the influence of the DC bias on the second (substrate-supporting) electrode, ions within the plasma are also accelerated toward the second electrode, impacting, and removing, the deposited resist material from the substrate surface and redepositing the resist material onto, for example, the sidewalls of nonplanar features. The DC bias on the second electrode needed to produce the desired randomization is generally determined empirically by, for example, measuring the thickness increase rate at points on control samples of the nonplanar substrate surface.

Randomization is also achieved, or increased, in a vapor or a mist by inducing turbulence or swirling motions in the vapor or mist (using conventional techniques), or by heating the nonplanar substrate surface onto which the resist is being deposited. The degree of turbulence, swirl, or substrate heating needed to achieve a desired degree of randomization is easily determined empirically.

Once a substantially conformal resist coating has been formed on a nonplanar substrate surface, as described above, the surface is patterned using conventional techniques. That is, the resist is exposed and developed (using conventional techniques), and the pattern defined in the resist is transferred, with little loss of linewidth control, into the underlying substrate by, for example, etching or metallizing the substrate through the patterned resist. Conventional processing steps are then employed to complete the fabrication of the desired device.

As a pedagogic aid to an even more complete understanding of the invention, the steps involved in lithographically patterning a nonplanar substrate surface using a Ge-Se glass film supporting a silver compound-containing layer, e.g., an $Ag_2Se$ layer (an inorganic resist), and HPR-204 (an organic polymer resist), are described below.

A nonplanar substrate surface is lithographically patterned with a Ge-Se/silver compound resist by initially depositing a Ge-Se glass layer onto the substrate surface from the vapor phase using, for example, e-beam evaporation or rf-sputtering. If the former technique is used, then a Ge-and-Se-containing target, as well as the nonplanar substrate to be coated, is placed within an evacuated chamber, and the Ge-and-Se-containing target is subjected to an electron beam, resulting in the evaporation of $Se_n(n=1, 2, \ldots, 8)$ atoms and molecules and Ge-Se molecules. The substrate is positioned relative to the target so that material removed from the target impinges the substrate. The background pressure within the evacuated chamber is preferably less than about $10^{-5}$ torr, while the beam power is preferably at least 100 watts. Under these conditions, the mean free path of the $Se_n(n=1, 2, \ldots, 8)$ atoms and molecules and Ge-Se molecules ranges from about 1 $\mu$m to about 20 $\mu$m. Pressures greater than about $10^{-5}$ torr are undesirable because the resulting deposited films are often contaminated by foreign matter, while beam powers less than about 100 watts are undesirable (although not precluded) because the resulting deposition rates are undesirably low.

If an rf-sputtering technique is used to vapor-phase deposit the Ge-Se glass layer, then the nonplanar substrate to be coated is mounted on, for example, the grounded electrode of a parallel-plate plasma sputtering machine, a Ge-and-Se-containing target is mounted on the power electrode of the machine, an inert gas is introduced into the machine, and a plasma glow discharge is struck in the gas by applying an rf-signal, e.g., a 13.56 MHz signal, to the power electrode. Useful inert gases include, for example, argon, krypton, and xenon. The pressure of the atmosphere within the plasma sputtering machine ranges from about $3 \times 10^{-3}$ torr to about $2 \times 10^{-1}$ torr and preferably ranges from about $5 \times 10^{-3}$ to about $5 \times 10^{-2}$, while the power density ranges from about 0.3 watts/cm$^2$ to about 0.75 watts/cm$^2$. Over these pressure and power density ranges, the mean free path, $\lambda$, of the $Se_n(n=1, 2, \ldots, 8)$ atoms and molecules and Ge-Se molecules ranges from about 1 $\mu$m to about 20 $\mu$m. Moreover, as the pressure and/or power density is increased, the mean free path decreases. Pressures less than about $3 \times 10^{-3}$ torr are undesirable because it is difficult, if not impossible, to strike a plasma, while pressures greater than about $2 \times 10^{-1}$ torr are undesirable (although not precluded) because they produce undesirably low deposition rates. Further, power densities less than about 0.3 watts/cm$^2$ are undesirable (although not precluded) because they, too, yield undesirably low deposition rates, while power densities greater than about 0.75 watts/cm$^2$ are undesirable because the substrate is subjected to excessive, damaging heating.

The (average) thickness of the Ge-Se glass layer (which is less than about the depth of the deepest depression or the height of the highest step to be coated) deposited onto the nonplanar substrate preferably ranges from about 0.1 $\mu$m to about 1 $\mu$m. A thickness less than about 0.1 $\mu$m is undesirable because the resulting film has an undesirably large number of defects, while a thickness greater than about 1 $\mu$m is undesirable because so thick a film requires an undesirably long developing time.

After the deposition of the Ge-Se glass film, a substantially conformal, silver-compound containing layer is formed on the upper surface of the glass film. One procedure for forming such a layer is to immerse the glass-covered substrate in an appropriate sensitizing bath. For example, an $Ag_2Se$ layer is formed on the glass film by immersing the glass-covered substrate in an $[Ag(CN)_2]^-$-containing aqueous solution, e.g., aqueous $KAg(CN)_2$. Alternatively, the sensitizing bath contains a silver complex whose ligand includes both hydrophobic and hydrophilic moieties. Such a ligand is, for example, ethylenediamine. The above baths, and their proper operation, are fully described in U.S. Pat. No. 4,343,887 issued to A. Heller and R. G. Vadimsky on Aug. 10, 1982 and copending, coassigned U.S. patent application Ser. No. 492,434, filed by C. H. Tzinis and R. G. Vadimsky on May 6, 1983, which are hereby incorporated by reference. The thickness of the $Ag_2Se$ layer ranges from about 50 Angstroms to about 150 Angstroms, and is preferably about 100 Angstroms. Thicknesses less than about 50 Angstroms or greater than about 150 Angstroms are undesirable because they result in an undesirably small change in the solubility of the exposed portions of the underlying Ge-Se glass (during the exposure procedure).

The Ge-Se glass film is patterned by first exposing selected portions of the glass to a form of energy which causes silver ions from the $Ag_2Se$ layer to migrate into the exposed regions of the Ge-Se glass film, decreasing the solubility of these regions to specific developers. Useful exposing energies are described in, for example, the above-referenced Tzinis-Vadimsky patent application. Then, the Se and $Ag_2Se$ remaining on the surface of the Ge-Se glass film is removed by, for example, immersion in a $KI-I_2$ solution which dissolves, i.e., oxidizes, the $Ag_2Se$ and Se to form $SeC_3^{2-}$ and $AgI_4^{3-}$. Patterning is achieved by either dry-developing or wet-developing the Ge-Se film. Dry development is achieved through contact with a plasma struck in an atmosphere of, for example, $CF_4$. Useful wet developers include hydroxide bases such as tetramethyl ammonium hydroxide and sodium sulfide. Finally, the pattern defined in the Ge-Se resist is transferred into the underlying nonplanar substrate by a series of conventional steps.

Rather than directly depositing the Ge-Se glass film onto the substrate, the imaging and masking functions of the Ge-Se film are separated, and the latter function dispensed with, by initially forming a masking layer on the nonplanar surface to be patterned, prior to the deposition of the Ge-Se film. This masking layer is, for example, an etch mask, a metallization mask, or ion implantation mask. Preferably, the thickness of the masking layer is substantially uniform, i.e., the thickness at any point differs from the average thickness by less than or equal to about 50 percent. Such a masking layer includes, for example, a layer of silicon dioxide or silicon nitride which is, for example, deposited onto the substrate using conventional chemical vapor deposition techniques. The (average) thickness of the masking layer, which depends upon its subsequent use, is conventional.

After the formation of the masking layer, the Ge-Se film is deposited, exposed and developed, as described above. The pattern defined in the Ge-Se film is then transferred, i.e., etched, into the underlying masking layer using, for example, a wet etchant such as buffered HF (for silicon dioxide) or phosphoric acid (for silicon nitride). The patterned Ge-Se film is removed using, for example, sodium hypochlorite and sodium thiosulfite, and the pattern defined in the masking layer is then, for example, etched into the underlying substrate, e.g., a silicon substrate, using a wet etchant such as potassium hydroxide, or by contacting a plasma struck in an atmosphere of, for example, $CFCl_3$ and $Cl_2$.

Figure 2:
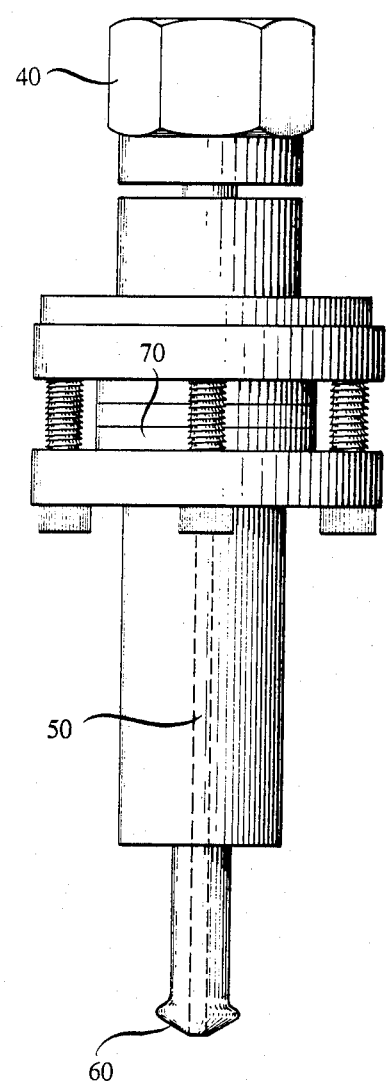
FIG. 2 is a cross-sectional view of an ultrasonic nozzle useful in conformally depositing organic polymer resists onto nonplanar substrates.

The lithographic patterning of a nonplanar substrate using HPR-204 resist is achieved by depositing the resist onto the substrate from a mist. Such a mist is formed, for example, by flowing the resist solution through an ultrasonic nozzle such as the ultrasonic atomizing nozzle sold by the Sono-Tek Corporation of Poughkeepsie, N.Y. and depicted in FIG. 2. In operation, the (liquid) resist solution is introduced into the liquid inlet pipe 40 (see FIG. 2) and flowed through the central aperture 50 to the surface 60 of the ultrasonic atomizing nozzle where the resist solution forms a thin liquid film under the influence of surface tension. By applying an AC voltage to the piezoelectric crystal 70, the nozzle is made to oscillate vertically (as viewed in FIG. 2), resulting in droplets being shaken off from the surface 60.

The size of the droplets produced by the nozzle, for a particular resist solution and a particular nozzle-substrate separation, depends primarily on the flow rate of the solution through the nozzle, as well as the amplitude and frequency of the AC voltage signal applied to the piezoelectric crystal 70. To a lesser extent, droplet size also depends on the flight time of the droplets to the nonplanar substrate to be coated (increasing the flight time results in increased resist solvent evaporation, and thus smaller droplets). For HPR-204 resist solution (as purchased from the Hunt Chemical Company), for a flow rate of 10 cc/min and an applied AC frequency of 78 kHz, varying the amplitude of the AC signal from 25 volts to 27.6 volts results in average droplet sizes, at a substrate positioned 6 inches from the end of the nozzle, ranging from about 44 $\mu$m to about 60 $\mu$m.

The degree of randomization (in the motions of the droplets) produced by the ultrasonic nozzle is sufficient to substantially conformably coat a variety of nonplanar substrates. However, randomization is enhanced by inducing a swirling motion in the droplet flow. For example, placing a circular cylindrical surface, 6 inches in diameter, just beneath the nozzle, and tangentially (to the cylindrical surface) injecting $N_2$ gas into the droplet-containing atmosphere beneath the nozzle, at a flow rate of about 30 liters/min, yields increased randomization. Unexpectedly, this also produces a decrease in average droplet size. For example, for the flow rate and frequency conditions described above, varying the amplitude of the AC voltage signal from 24 volts to 26.5 volts results in average droplet sizes (at a substrate positioned 6 inches from the end of the nozzle) ranging from about 26 $\mu$m to about 16 $\mu$m. Further varying the AC voltage amplitude from 26.5 volts to 28.5 volts results in average droplet sizes ranging from about 16 $\mu$m to about 22 $\mu$m.

The thickness of the deposited HPR-204 resist preferably ranges from about 0.3 $\mu$m to about 2 $\mu$m. A thickness less than about 0.3 $\mu$m is undesirable because such a resist has an undesirably large number of defects, e.g., pinholes, while a thickness greater than about 2 $\mu$m is undesirable because so thick a resist yields undesirably poor feature resolution.

Once a layer of HPR-204 has been substantially conformably deposited onto a nonplanar substrate, the resist is exposed and developed, and the substrate patterned, using conventional techniques.

EXAMPLE 1

The following describes the patterning of the (100) surface of a 3-inch silicon wafer to form a nonplanar surface, as well as the e-beam deposition onto this nonplanar surface of a substantially conformal layer of $Ge_{0.15}Se_{0.85}$.

A 5000 Angstrom-thick layer of $SiO_2$ was grown on the (100) surface of a 3-inch silicon wafer using conventional thermal oxidation techniques. The $SiO_2$ layer was selectively etched in buffered HF to form 100 $\mu$m $\times$ 200 $\mu$m rectangular $SiO_2$ islands. Each of the four sides of each island was aligned with a different one of the four $<110>$ directions. Using the patterned $SiO_2$ layer as an etch mask, the underlying silicon was then anisotropically, i.e., crystallographically, etched in a solution of KOH and isopropyl alcohol to form crisscrossing trenches. The depth and width of the trenches were, respectively, about 80 $\mu$m and about 100 $\mu$m. Moreover, each trench sidewall formed an acute angle of +35.26 degrees with a perpendicular drawn to the original (100) surface of the silicon wafer. After the etching of the trenches, the $SiO_2$ etch mask was removed with buffered HF.

The patterned silicon wafer was mounted on the planet of a conventional e-beam deposition machine. A Ge-and-Se-containing ($Ge_{0.15}Se_{0.85}$) target was also placed within the e-beam machine. The ambient pressure within the machine was about $2 \times 10^{-6}$ torr. The target was then subjected to an electron beam having a power of about 200 watts. The resulting rate of deposition of $Ge_{0.15}Se_{0.85}$ onto the patterned surface of the silicon wafer, as determined from a conventional quartz crystal thickness monitor, was about 12 Angstroms per second. Deposition was continued until the average thickness of the deposited $Ge_{0.15}Se_{0.85}$ (as also determined from the quartz crystal monitor) was about 2000 Angstroms.

The mean free path of the $Se_n(n=1, 2, \ldots, 8)$ atoms and molecules and Ge-Se molecules within the e-beam machine was estimated to be less than 10 $\mu$m. This estimate was arrived at by noting that the $Ge_{0.15}Se_{0.85}$ target was melted by the e-beam. Because the melting temperature of $Ge_{0.15}Se_{0.85}$ is approximately 520 degrees C. (in this regard see, e.g., F. A. Shunk, *Constitution of Binary Alloy* (2nd Supplement), McGraw-Hill, 1969, p. 394), it follows that the deposition temperature was at least about 520 degrees C. At this temperature, the partial pressure of $Se_n(n=1, 2, \ldots, 8)$ and Ge-Se is, respectively, 15 torr and 0.45 torr (in this regard see, e.g., *Proceedings of the Electrochemical Symposium on Inorganic Resist Systems*, Montreal, 1982, p. 227 and references therein). Thus, assuming a partial pressure of 15 torr, the plot of partial pressure versus mean free path on page 1-22 of the *Handbook of Thin Film Technology*, supra, for atoms and molecules having effective cross-sections in the range 2-5 Angstroms, which encompasses the effective cross-sections of $Se_n(n=1, 2, \ldots, 8)$ and Ge-Se, was used to arrive at the estimated mean free path.

Scanning electron microscopic (SEM) photos were made of cross-sectional slices of the $Ge_{0.15}Se_{0.85}$-covered silicon wafer. Using a ruler (1 cm=1 μm), the average thickness of the deposited $Ge_{0.15}Se_{0.85}$ layer, across the entire nonplanar surface of the silicon wafer, was measured to be about 2000 Angstroms, with thickness variations less than or equal to ±15 percent.

EXAMPLE 2

The (100) surface of a 3-inch silicon wafer was patterned, to form a nonplanar surface, as described in Example 1. A 5000 Angstrom-thick layer of $SiO_2$ was grown on the nonplanar surface, using conventional thermal oxidation techniques. (The thickness of the $SiO_2$ layer was determined from SEM photos of cross-sectional slices of the $SiO_2$-covered wafer.) A layer of $Ge_{0.15}Se_{0.85}$ was deposited onto the $SiO_2$ layer, again yielding a thickness of 2000 Angstroms ±15 percent.

EXAMPLE 3

A 2 μm-thick layer of $SiO_2$ was grown on the (100) surface of a 4-inch silicon wafer using conventional thermal oxidation techniques. Buffered HF was then used to etch an array of square, 1 cm×1 cm, windows through the thickness of the $SiO_2$ layer. Each of the four sides of each window was aligned with a different one of the four <110> directions. Using the patterned $SiO_2$ layer as an etch mask, the underlying silicon was then crystallographically etched in a solution of KOH and isopropyl alcohol to form an array of wells in the silicon. At the original wafer surface, the wells were square in outline with dimensions of 1 cm×1 cm. The depth of each well was about 200 μm. Each sidewall of each well formed an acute angle of +35.26 degrees with a perpendicular drawn to the original (100) surface of the silicon wafer. After the etching of the wells, the $SiO_2$ etch mask was removed with buffered HF.

A 5000 Angstrom-thick layer of $SiO_2$ was grown on the patterned surface of the silicon wafer using conventional thermal oxidation techniques. Successive layers of Ti, Pd, and Au, having thicknesses of, respectively, 500 Angstroms, 5000 Angstroms, and 5000 Angstroms, were deposited onto the $SiO_2$ layer using conventional rf-deposition techniques.

The $SiO_2$-and-metal-covered silicon wafer was placed on the grounded electrode of a parallel plate, rf-sputter deposition machine. A Ge-and-Se-containing ($Ge_{0.15}Se_{0.85}$) target was placed on the power electrode of the machine, which was spaced 2 inches from the grounded electrode. The machine was evacuated and argon was flowed into the machine to produce a pressure of about $5 \times 10^{-3}$ torr. A 13.56 MHz AC signal was applied to the power electrode, producing a power density of 0.5 watts/$cm^2$, and resulting in the sputter deposition of $Ge_{0.15}Se_{0.85}$ onto the silicon wafer. Under these conditions, and using the procedure described in Example 1, the mean free path of the atoms and molecules in the sputter deposition machine was estimated to be less than 10 μm. From previous experience, it was known that the deposition rate was 7 Angstroms per second. Deposition was continued for a time sufficient to deposit a 2000 Angstrom-thick layer of $Ge_{0.15}Se_{0.85}$.

SEM photos were made of cross-sectional slices of the silicon wafer. Using a ruler (1 cm=1 μm), the average thickness, and the thickness variations, of the deposited $Ge_{0.15}Se_{0.85}$ layer were measured to be the same as in Examples 1 and 2.

EXAMPLE 4

The (100) surface of a 3-inch silicon wafer was patterned, to form a nonplanar surface, as described in Example 1. The patterned wafer was placed 6 inches from the output end of an ultrasonic atomizing nozzle purchased from the Sono-Tek Corporation of Poughkeepsie, N.Y. and depicted in FIG. 2. HPR-204 resist solution, as purchased from the Hunt Chemical Company, was then flowed through the nozzle at 10 cc/min for 1 minute while an AC signal having a frequency of 78 kHz and an amplitude of 24 volts was applied to the piezoelectric crystal of the nozzle. The resulting averge droplet size at the wafer surface was known (from previous experience) to be about 44 μm.

SEM photos were made of cross-sectional slices of the resist-covered silicon wafer. Using a ruler (1 cm=1 μm), the thickness of the deposited HPR-204, at the corners defined by the intersections of the original (100) silicon wafer surface and the sidewalls of the trenches etched into the wafer, was measured to be 0.5 μm. Everywhere else the thickness was measured to be 0.7 μm.

What is claimed is:

1. A method for fabricating a device, comprising the steps of:
    forming an energy sensitive material on a substrate surface;
    exposing selected portions of said energy sensitive material to energy;
    treating said energy sensitive material with a developing agent; and
    completing the fabrication of said device, characterized in that said substrate surface is nonplanar and includes at least one depression or at least one step having a depth or height greater than or equal to about 5 μm,
    said forming step includes the step of depositing said energy sensitive material onto said surface from a vapor or from a mist, and
    said energy sensitive material substantially conformably coats said substrate surface, the average thickness of said material being less than about the larger of the depth of the deepest depression or the height of the highest step on the portion or portions of said nonplanar substrate surface to be coated.

2. The method of claim 1 wherein the motions of the constituents of said vapor or mist are sufficiently random so that the angular flux distribution at any point on said nonplanar substrate surface is substantially identical to that at any other point on said surface.

3. The method of claim 1 wherein said energy sensitive material includes an organic polymer.

4. The method of claim 1 wherein said energy sensitive material includes a chalcogenide glass.

5. The method of claim 4 wherein said chalcogenide glass is a Ge-Se glass.

6. The method of claim 1 wherein a masking layer is formed on said nonplanar substrate surface prior to the formation of said energy sensitive material.

7. A product formed by a process comprising the steps of:
    forming an energy sensitive material on a substrate surface;
    exposing selected portions of said energy sensitive material to energy;
    treating said energy sensitive material with a developing agent;

patterning said substrate surface by etching, or depositing material onto, said substrate surface while using said exposed and developed energy sensitive material as an etch mask or a deposition mask; and
completing the fabrication of said device, said completing step including the step of incorporating at least a portion of said patterned substrate surface into said product, characterized in that
said substrate surface is nonplanar and includes at least one depression or at least one step having a depth or height greater than or equal to about 5 μm.

* * * * *